United States Patent
Peluso

(10) Patent No.: US 9,444,414 B2
(45) Date of Patent: Sep. 13, 2016

(54) CURRENT SENSE CIRCUIT USING A SINGLE OPAMP HAVING DC OFFSET AUTO-ZEROING

(71) Applicant: QUALCOMM Incorporated, San Diego, CA (US)

(72) Inventor: Vincenzo Peluso, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 47 days.

(21) Appl. No.: 14/329,615

(22) Filed: Jul. 11, 2014

(65) Prior Publication Data

US 2016/0013765 A1 Jan. 14, 2016

(51) Int. Cl.
*H03F 1/02* (2006.01)
*H03F 3/00* (2006.01)
*H03F 3/45* (2006.01)
*H03F 1/30* (2006.01)

(52) U.S. Cl.
CPC ............ *H03F 3/005* (2013.01); *H03F 1/303* (2013.01); *H03F 3/45179* (2013.01); *H03F 2200/231* (2013.01); *H03F 2203/45156* (2013.01)

(58) Field of Classification Search
CPC ............. H03F 1/02; H03F 1/08; H03K 5/00; H03M 1/00; H03M 3/00
USPC ........ 330/9, 51, 69, 107, 109, 257; 327/124, 327/307, 337, 341, 551, 561; 333/173; 341/61, 77, 114, 118, 132, 134, 135, 341/136, 139, 142, 143, 144, 150, 155, 156, 341/172, 186
See application file for complete search history.

(56) References Cited

U.S. PATENT DOCUMENTS

| | | | | |
|---|---|---|---|---|
| 5,479,130 A | * | 12/1995 | McCartney | .......... G06G 7/1865 327/337 |
| 6,781,450 B1 | * | 8/2004 | Mercer | ............... H03F 3/45753 330/69 |
| 7,321,260 B2 | | 1/2008 | Larson | |
| 8,624,766 B2 | | 1/2014 | Pulijala | |
| 2009/0273392 A1 | | 11/2009 | Korobeynikov et al. | |
| 2015/0035813 A1 | * | 2/2015 | Lei | ....................... G09G 3/3208 345/205 |

FOREIGN PATENT DOCUMENTS

JP 2005020291 A 1/2005

OTHER PUBLICATIONS

Dunlap, et al., "A Noise-Shaped Switching Power Supply Using a Delta-Sigma Modulator" IEEE Transactions on Circuits and Systems-I: Regular Papers, vol. 51, No. 6, Jun. 2004.*

(Continued)

*Primary Examiner* — Steven J Mottola
*Assistant Examiner* — Hafizur Rahman
(74) *Attorney, Agent, or Firm* — Haynes and Boone, LLP

(57) ABSTRACT

A current sense circuit having a single opamp DC offset auto-zero capability that allows for continuous current sensing operation while at the same time providing for DC offset sensing and compensation. The single opamp design can operate in a first phase to sense and store a DC offset, while providing an output to drive an output stage of the current sense circuit. The single opamp design can operate in a second phase, using the sensed DC offset to generate an accurate output that can drive the output stage and which can be used in the first phase.

24 Claims, 14 Drawing Sheets

(56) References Cited

OTHER PUBLICATIONS

Enz C.C., et al., "Circuit Techniques for Reducing the Effects of Op-Amp Imperfections: Autozeroing, Correlated Double Sampling, and Chopper Stabilization," Proceedings of the IEEE, Nov. 1996, vol. 84 (11), pp. 1584-1614.

International Search Report and Written Opinion—PCT/US2015/038126—ISA/EPO—Oct. 21, 2015.

Lin J., et al., "Offset-Compensated Area-Efficient Switched-Capacitor Sum-Gain Amplifier", Proceedings of the International Symposium on Circuits and Systems. (ISCS). Chicago, May 3-6, 1993; [Proceedings of the International Symposium on Circuits and Systems. (ISCS)], New York, IEEE, US, vol. -, May 3, 1993, pp. 1026-1029, XP010115276, DOI: 10.1109/ISCAS.1993.393899 ISBN: 978-0-7803-1281-4.

Radev N.A., et al., "Comparative Analysis of Two Gain- and Offset Compensated Very Large Time Constant Switched-capacitor Integrators", Microelectronics, 2000. ICM 2000. Proceedings of the 12th Internationa l Conference on Oct. 31-Nov. 2, 2000, Piscataway, NJ, USA,IEEE, Oct. 31, 2000, pp. 51-54, XP010538939, ISBN: 978-964-360-057-0.

Shi X., et al., "Gain- and offset-compensated non-inverting SC Circuits", Circuits and Systems, 2000. Proceedings. ISCAS 2000 Geneva. The 2000 I EEE International Symposium on May 28-31, 2000, Piscataway, NJ, USA,IEEE, vol. 2, May 28, 2000, pp. 425-428, XP010502751, ISBN: 978-0-7803-5482-1.

Yoshizawa H., et al., "Switched-Capacitor Track-and-Hold Amplifiers With Low Sensitivity to Op-Amp Imperfections", IEEE Transactions on Circuits and Systems Part I: Regular Papers, IEEE Service Center, New York, NY, US, vol. 54, No. 1, Jan. 1, 2007, pp. 193-199, XP011155732, ISSN: 1057-7122, DOI: 10.1109/TCS1.2006.887454.

* cited by examiner

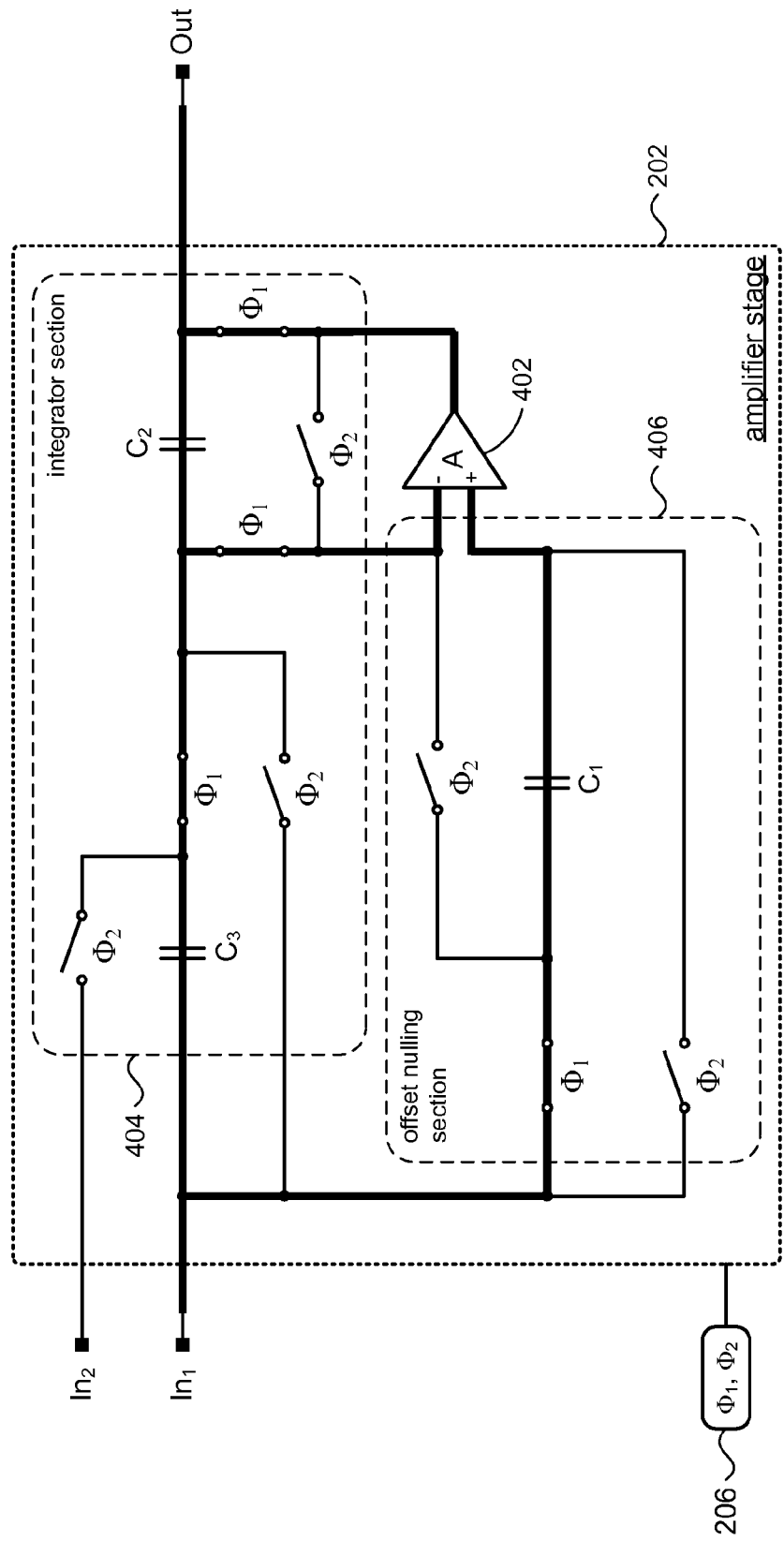

CURRENT SENSE CIRCUIT USING A SINGLE OPAMP HAVING DC OFFSET AUTO-ZEROING

BACKGROUND

Unless otherwise indicated, the foregoing is not admitted to be prior art to the claims recited herein and should not be construed as such.

Knowing the amount of current being delivered to a load can be useful in a wide variety of applications. For example, in low-power electronic devices (e.g., smart phone, computer tablets, and other consumer electronics) the supply current can be monitored to understand the system's impact on battery life. The load current also can be used to make safety-critical decisions in over-current protection circuits. Generally, a current sensor is a circuit that can detect a current (e.g., current through a load) and produce an output current that is representative of the detected current. In some circuit applications, the output current can be converted to an easily measured output voltage that is proportional to the detected current.

In typical current sensing circuit designs, it is important to be able to produce a sense current that accurately represents (replicates) the current flowing (the current being sensed) through the pass device that supplies current to the load. Analysis of accuracy limitations of producing a sense current of a current flowing through a pass device has shown that the replica device voltage drop across the channel must match the voltage drop across the channel of the pass device very accurately. Typically, an active high gain feedback loop is used, which employs one or more amplifiers. The offset in each amplifier should be reduced to very low values in order to produce an accurate sense current.

A technique called "auto-zeroing" can automatically drive the DC offset of an amplifier to zero. Auto zeroing uses a switched capacitor technique. The conventional switched capacitor auto zero technique is one that prevents the amplifier from being used during part of a repeating cycle during which a capacitor samples its offset. FIG. 1, for example, shows a basic switched capacitor auto zero design. At time $\phi 1$, switches S1 and S2 are closed and switch S3 is open, allowing the capacitor C to sense and store the DC offset Vos of amplifier A. At time $\phi 2$, switches S1 and S2 are open and switch S3 is closed, allowing the amplifier A to operate on signal x(t), using the voltage stored in capacitor C to cancel the DC offset of amplifier A. However, during time $\phi 1$, when the DC offset is being sensed by capacitor C, the amplifier A cannot be used to process signal x(t). This intermittency can degrade the performance of a circuit that uses amplifier A. Alternatives that do not exhibit this drawback use two opamps, each with two inputs. Such designs are therefore large, requiring more die area and consuming more power.

SUMMARY

In embodiments, a circuit includes an amplifier section that has an integrator section, an amplifier section, and an offset nulling section. The amplifier section can be connected to or disconnected from an output of the circuit. The amplifier section can be disconnected from the output of the circuit when the offset nulling section is storing an offset of the amplifier section. The integrator section can drive the output of the circuit when the amplifier section is disconnected from the output, and sense an error signal at the inputs of the circuit. The amplifier section can be connected to the output of the circuit to generate a control signal when the integrator section is connected to the amplifier section. The offset nulling section can compensate for the DC offset of the amplifier section.

In some embodiments, the amplifier section contains a single opamp. In some embodiments, the amplifier is a differential mode amplifier.

In some embodiments, the circuit may be connected in a current sense circuit.

In some embodiments, the circuit may include switches to configure the connections among the amplifier section, the integrator section, and the offset nulling section.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings:

FIG. 4A illustrates phase $\phi 1$ operation of the amplifier stage shown in FIG. 4.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
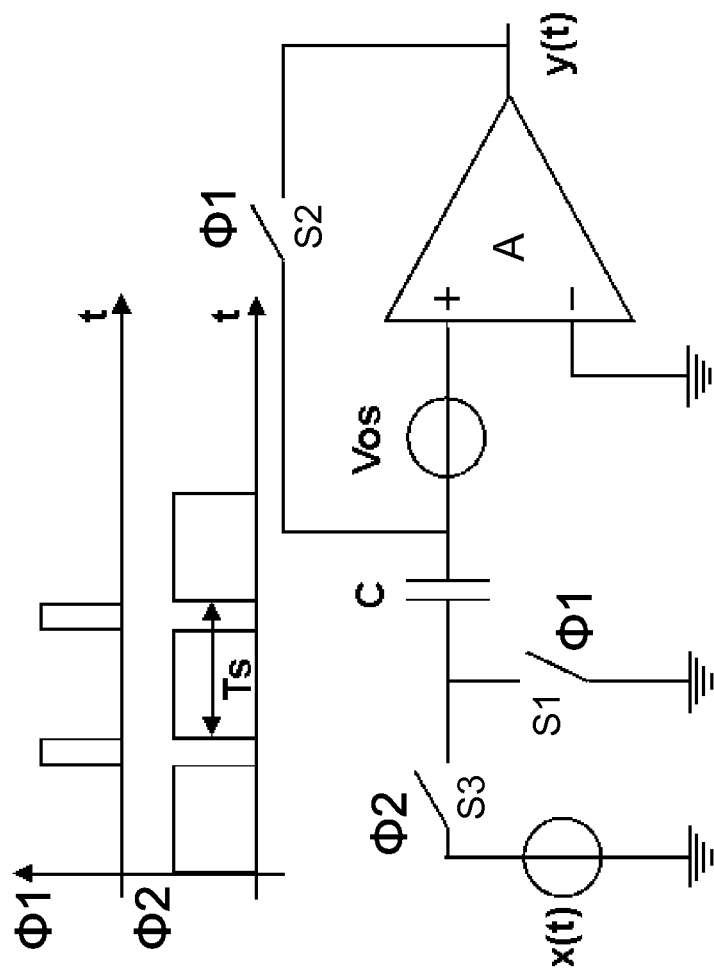
FIG. 1 shows a conventional switched capacitor design for DC offset compensation.
Figure 2:
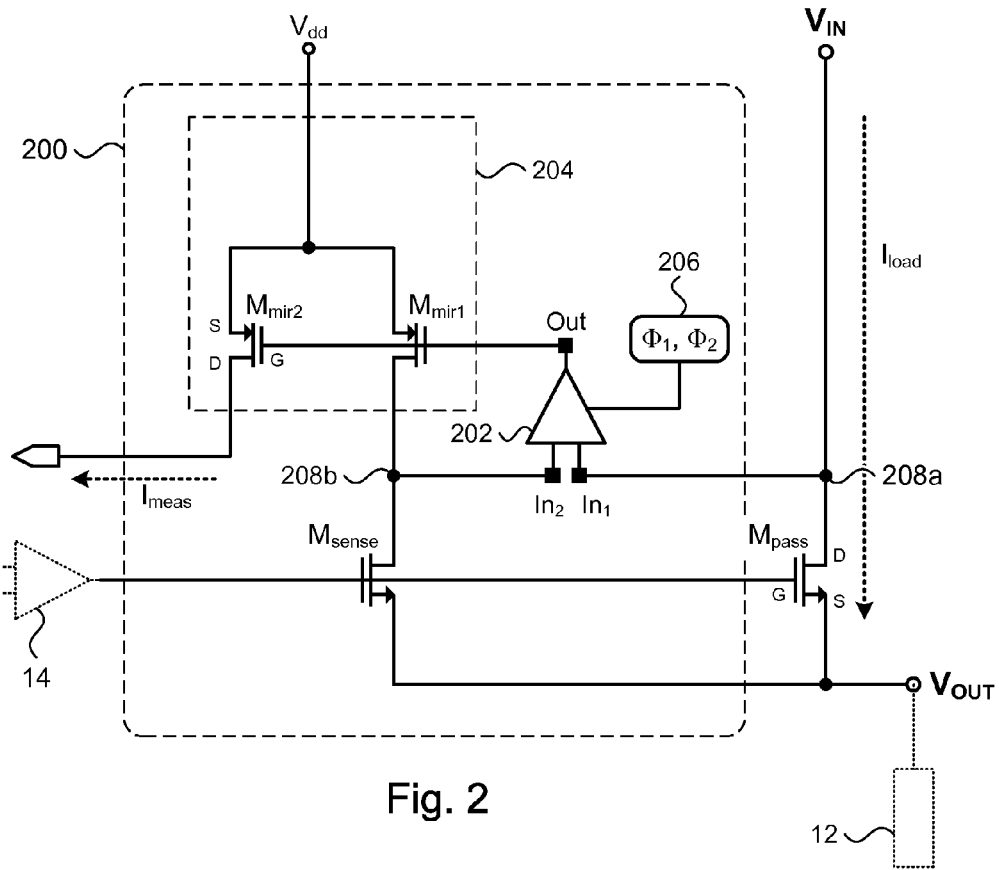
FIGS. 2 and 3 illustrate examples of current sensing circuits in accordance with the present disclosure.
Figure 7:
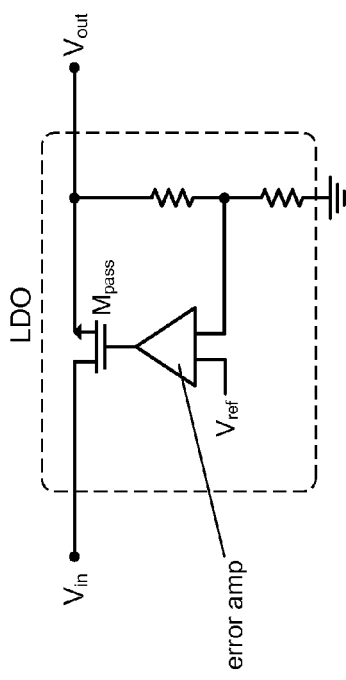
FIG. 7 shows an example of a low dropout regulator.

FIG. 2 shows a current sensing circuit 200 for sensing current flow in an electronic circuit (not shown) in accordance with the present disclosure. The current sensing circuit 200 may sense the current flow $I_{load}$ flowing through a pass device $M_{pass}$ into load 12 that is controlled by a control device 14. In some embodiments, for example, the pass device $M_{pass}$ and control device 14 may constitute a low dropout (LDO) regulator. The control device 14 may be the error amplifier of the LDO (see FIG. 7, for example). It will be appreciated, however, that in other embodiments, the pass device $M_{pass}$ and control device 14 may be components of any applicable electronic circuitry for driving load 12.

In some embodiments, the current sensing circuit 200 may comprise a sense device $M_{sense}$ that is configured with pass device $M_{pass}$ as a current mirror. The control inputs (e.g., gate terminals in the case of a field-effect transistor, FET) of $M_{pass}$ and $M_{sense}$ may be connected to the control device 14, and the outputs (e.g., source terminals) of $M_{pass}$ and $M_{sense}$ may be connected to the load.

In order to accurately mirror the current through $M_{pass}$, the voltage drop $V_{DS}$ across the channel of $M_{pass}$ and the channel of $M_{sense}$ should match. Accordingly, the current sensing circuit 200 may utilize a high gain feedback loop that includes an amplifier stage (amplifier circuit) 202 to drive an output stage 204 to regulate the voltage level at input node 208b (e.g., drain terminals) of $M_{sense}$ to match the voltage level at input node 208a. As will be explained below, in some embodiments, the amplifier stage 202 may operate based on timing signals from timing circuitry 206.

Figure 8:
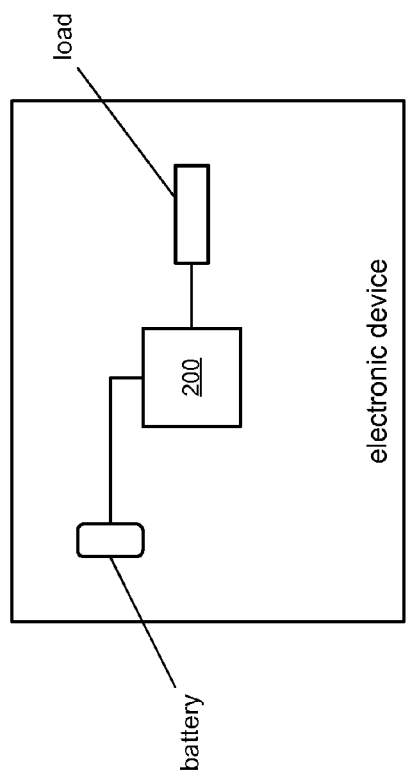
FIG. 8 is a block diagram showing a current sensing device incorporated in an electronic device.

The output stage 204 may comprise FET $M_{mir1}$ that operates as a current source. The output (Out) of amplifier stage 202 may control the amount of current that flows through $M_{mir1}$. The output stage 204 may further comprise FET $M_{mir2}$ that is configured with $M_{mir1}$ as a current mirror. The current flow (sense current) $I_{meas}$ through $M_{mir2}$ is representative of the load current $I_{load}$. In some embodiments, the size of $M_{mir2}$ may be dimensioned (gate width, gate length) with respect to $M_{mir1}$ so that the current amplification ratio produces a suitable signal for $I_{meas}$. In some embodiments, the current mirror $M_{mir1}$, $M_{mir2}$ may be biased using an internal voltage level $V_{dd}$ that can be generated in an electronic device (e.g., FIG. 8) that incorporates the current sensing circuit 200. For example, in a battery operated device as illustrated in FIG. 8 (e.g., cellular phone, computer tablet, etc.) the internal voltage $V_{dd}$ may come from the battery. In some embodiments, the current sensing circuit 200 may be used in sub-regulating the output (e.g., <battery voltage) of a switching power converter, e.g., as in a buck converter (not shown).

In operation, the amplifier stage 202 may regulate $M_{mir1}$ in a feedback loop to drive the voltage difference (error) at nodes 208a, 208b sensed between inputs $In_1$, $In_2$ to zero. As the load current $I_{load}$ varies, so will the voltage at $In_1$. Current through $M_{mir1}$ can be regulated to provide the same voltage at $In_2$. FET $M_{mir2}$ mirrors the current through $M_{mir1}$, and thus provides a sense current $I_{meas}$ that is representative of the load current $I_{load}$. In accordance with the present disclosure, the DC offset in amplifier stage 202 can be significantly reduced to maintain an accurate match between the voltage drop $V_{DS}$ across the channel of $M_{sense}$ and the channel of $M_{pass}$. Additional details of the amplifier stage 202 will be provided below.

Figure 3:
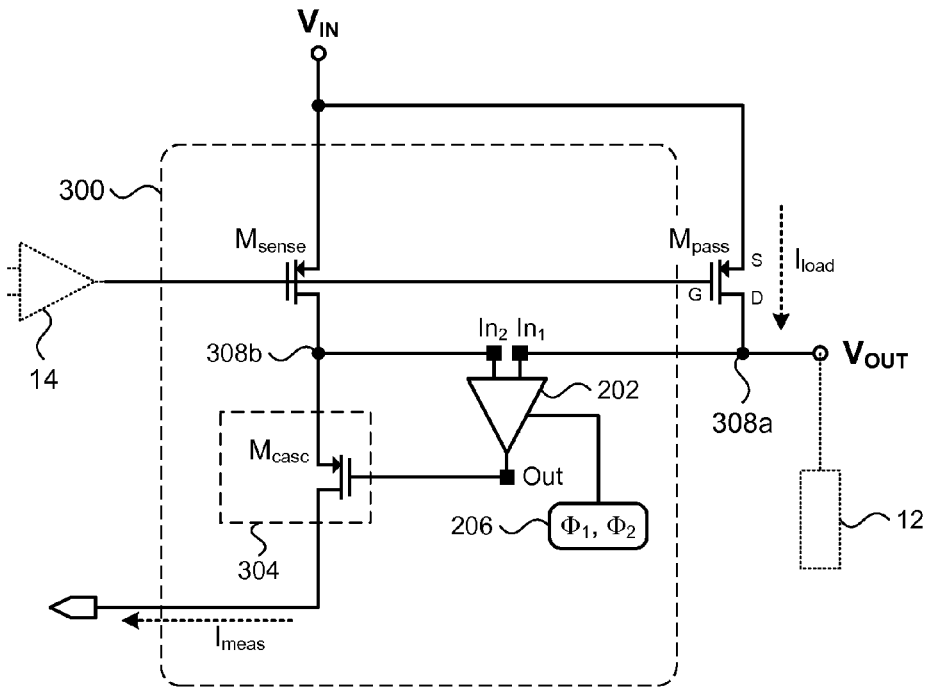

The current sense circuit 200 in FIG. 2 is suitable for a design where the pass device $M_{pass}$ is an NMOS device. Referring to FIG. 3, a current sense circuit 300 is shown that can be used in a design where the pass device $M_{pass}$ is a PMOS device. The output stage 304 may comprise FET $M_{casc}$ that is configured with $M_{sense}$ as a cascode. In this embodiment, the output of $M_{casc}$ produces the sense current $I_{meas}$. The inputs $In_1$, $In_2$ of amplifier stage 202 may be connected to nodes 308a, 308b (e.g., drain terminals) of $M_{pass}$ and $M_{sense}$, respectively. In operation, the amplifier stage 202 regulates $M_{casc}$ in a feedback loop to reduce the difference in voltage between nodes 208a, 208b sensed at inputs $In_1$, $In_2$ to zero. As the load current $I_{load}$ varies, so will the voltage at $In_1$. Current through $M_{casc}$ will be regulated so that the same voltage at node 308b appears at $In_2$. The current output from $M_{casc}$ thus provides an output sense current $I_{meas}$ that is representative of the load current $I_{load}$.

Figure 4:
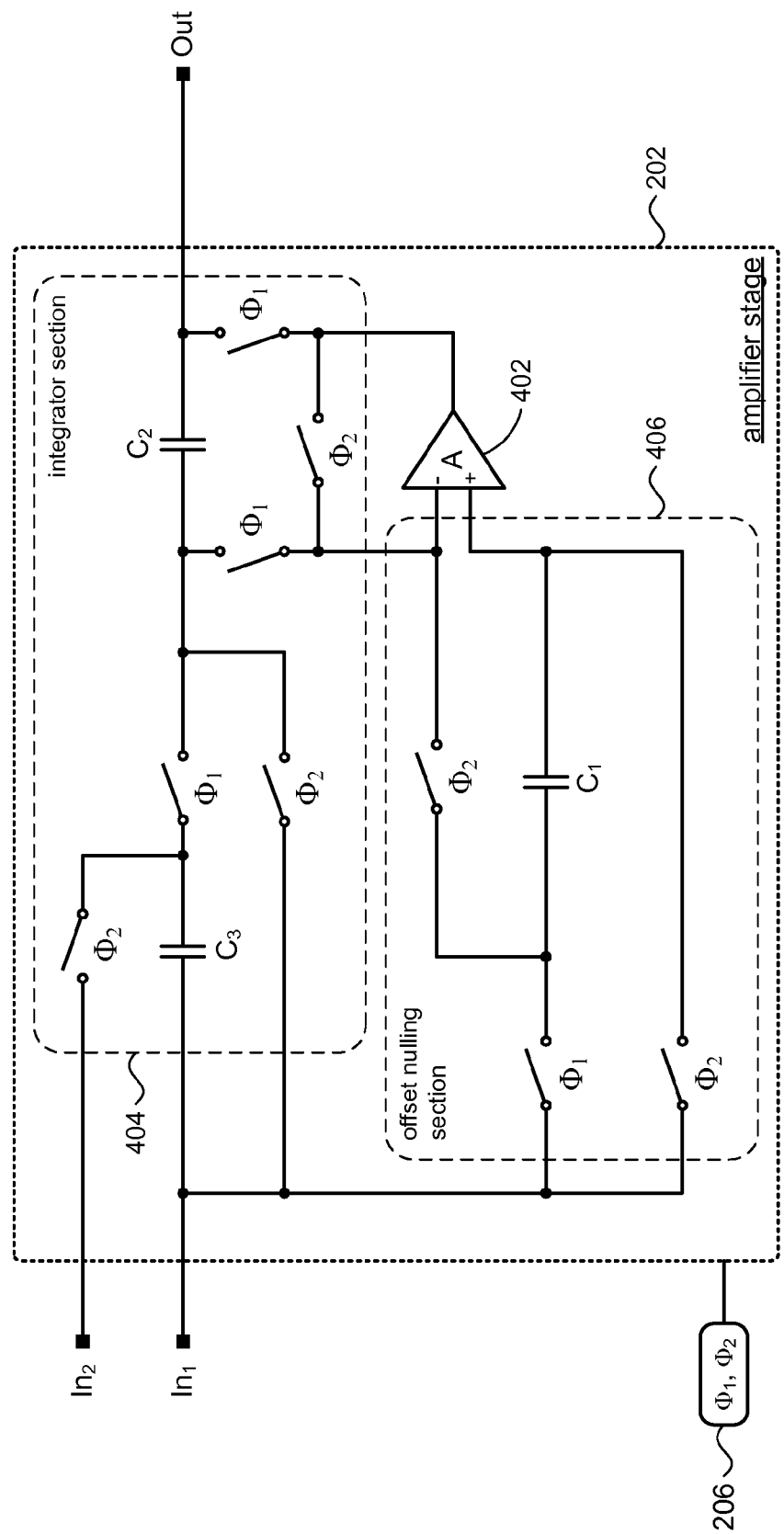
FIG. 4 illustrates an embodiment of an amplifier stage in accordance with the present disclosure.

Referring to FIG. 4, additional details of amplifier stage 202 in accordance with the present disclosure will now be described. In some embodiments, the amplifier stage 202 may comprise two inputs $In_1$, $In_2$, and an output Out. Components in the amplifier stage 202 may include an amplifier section (amplifier) 402, an integrator section 404, and an offset nulling section 406. The amplifier 402 may be a conventional two-input operational amplifier (opamp), having an inverting (−) input and a non-inverting (+) input. In accordance with the present disclosure, the amplifier 402 comprises a single opamp.

The amplifier stage 202 may further include switches φ1 and φ2 that can alternate between two different configurations of OPEN and CLOSE. In some embodiments, the timing circuitry 206 (e.g., a clock circuit) may generate control signals φ1, φ2 to operate the switches to the OPEN state or the CLOSE state. For example, the switches identified by φ1 can OPEN and CLOSE in accordance with a control signal φ1, while the switches identified by φ2 can OPEN and CLOSE in accordance with a control signal φ2. While, in some embodiments, the timing circuitry 206 uses two control signals φ1, φ2 to alternate between the two switch configurations, it will be appreciated from the description to follow that in other embodiments the timing circuitry may use additional signals to control the switches between configurations.

Figure 9A:
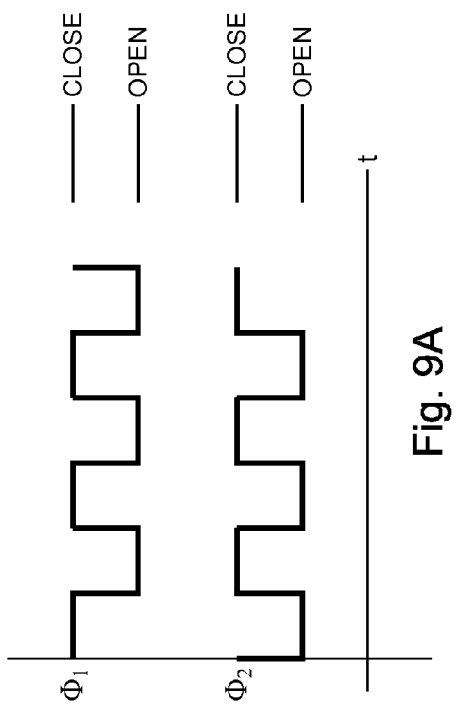
FIGS. 9A and 9B illustrate timing diagrams of $\phi 1$ and $\phi 2$ clocks.
Figure 9B:
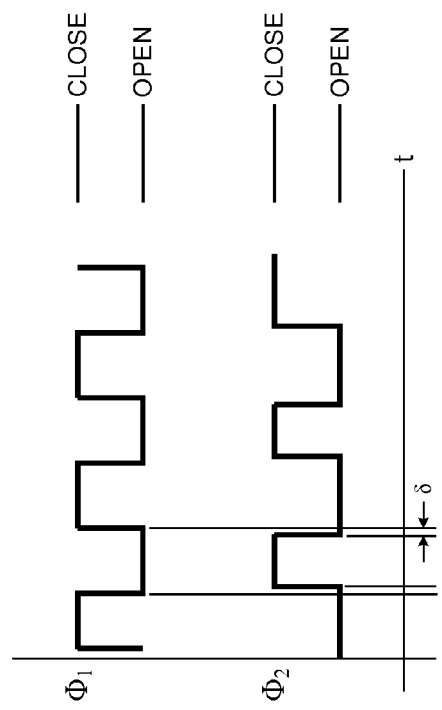

Referring to FIG. 9A for a moment, in some embodiments, control signals φ1 and φ2 may be clock pulses. Each φ1 clock and φ2 clock may have a 50% duty cycle and be 180° out of phase with respect to each other. In practice, it is preferable that the φ1 switches and the φ2 switches do not CLOSE at the same time, since doing so can create shorts in the circuitry and other undesirable circuit conditions. Accordingly, in some embodiments, the duty cycle of one or both the φ1 and the φ2 clocks can be adjusted so that a slight delay can be introduced between the falling and rising edges of the clocks to ensure break-before-make operation between the φ1 switches and the φ2 switches. FIG. 9B, for example, shows clock pulses φ1, φ2 where a delay δ is introduce between the falling edges of φ1 and rising edges of φ2, and between the rising edges of φ1 and falling edges of φ2.

Continuing with FIG. 4, in some embodiments, the integrator section 404 may comprise a capacitor (output capacitor) C2 and a capacitor (error capacitor) C3. One side of capacitor C2 is connected to the output (Out) of amplifier stage 202. One side of capacitor C3 is connected to the $In_1$ input of the amplifier stage 202. In one configuration of the switches, the capacitors C2, C3 can be connected in series, and connected to the amplifier 402 in a feedback loop. In another configuration of the switches, the capacitors C2, C3, and amplifier 402 only share the $In_1$ input as a common reference ("virtual ground"), but are otherwise disconnected from each other.

In some embodiments, the offset nulling section 406 may comprise a capacitor (offset capacitor) C1. In one configuration of the switches, the capacitor C1 can be connected to sense and store a DC offset voltage of the amplifier 402. In another configuration of the switches, the capacitor C1 can be connected to apply the stored voltage to the amplifier 402 to compensate the amplifier's DC offset.

Referring now to FIG. 4A, operation of the amplifier stage 202 in phase $\phi1$ will be described. The electrical path set up by this configuration of the switches is shown in heavy lines. In phase $\phi1$, the capacitor C3 is connected to the amplifier 402. The output of amplifier 402 will drive the output (Out) of the amplifier stage 202 based on the charge stored in C3.

Since capacitor C2 is connected in a negative feedback loop, one of ordinary skill will understand that the amplifier 402 will effectively add the charge that is stored in C3 to the charge that is already stored in C2. The negative feedback loop will limit the amount of charge stored in C2 to the amount of charge in C3. The DC offset in amplifier 402, which would cause too much charge or too little charge to accumulate in C2, can be compensated for by capacitor C1; this will become more apparent from the description of operation of the amplifier stage 202 during phase $\phi2$.

Figure 4B:
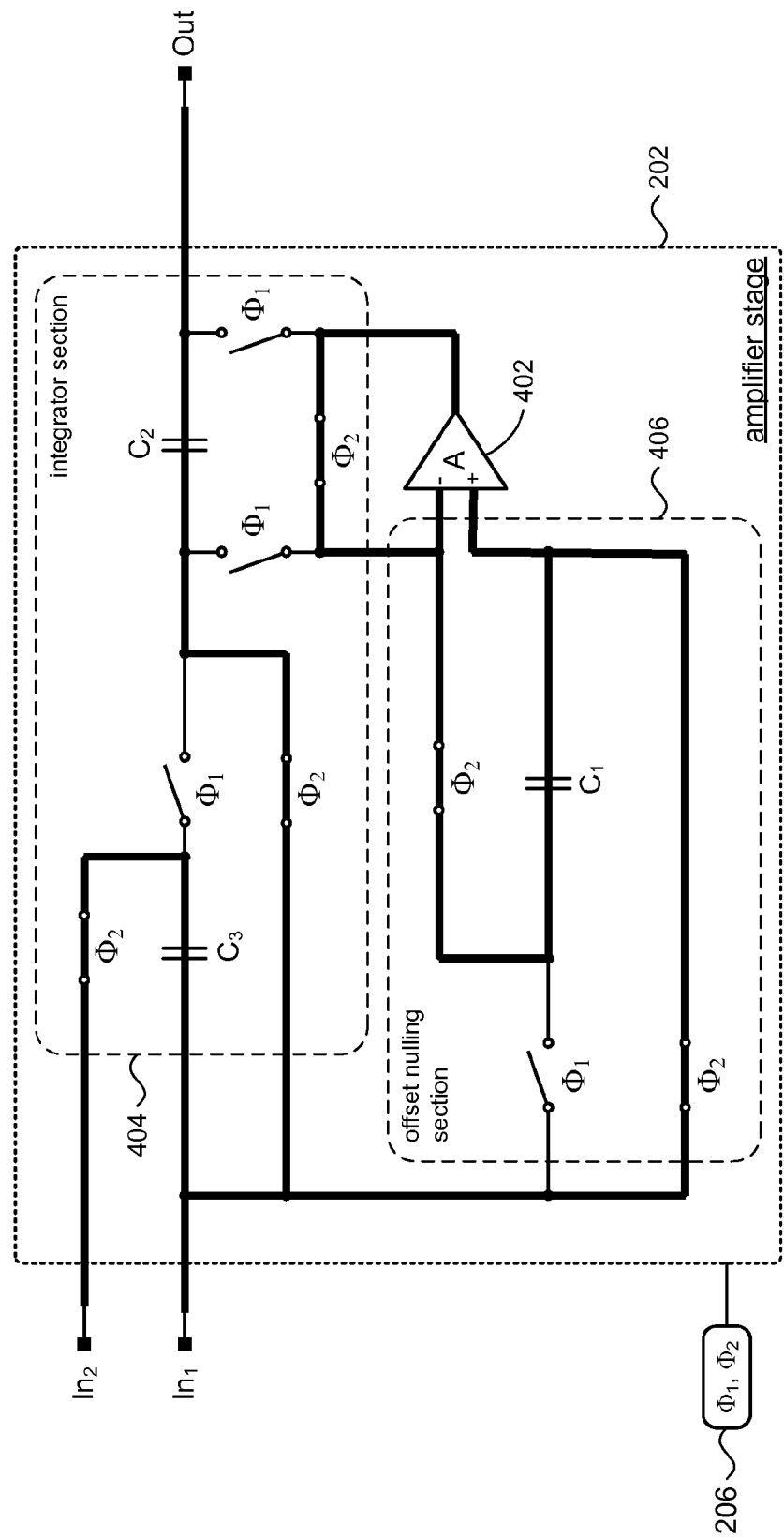
FIG. 4B illustrates phase $\phi 2$ operation of the amplifier stage shown in FIG. 4.

Referring now to FIG. 4B, operation of the amplifier stage 202 in phase $\phi2$ will be described. The electrical path set up by this configuration of the switches is shown in heavy lines. In phase $\phi2$, the integrator section 404 is disconnected from the amplifier 402, and the output of amplifier 402 is disconnected from the output (Out) of amplifier stage 202. Note in FIG. 4A, during phase $\phi1$, capacitor C2 is referenced to the $In_1$ input of the amplifier stage 202 through capacitor C3. In phase $\phi2$, since C2 is still being referenced to $In_1$, the charge stored on capacitor C2 can drive the output (Out) of amplifier stage 202. Thus, although the amplifier 402 is disconnected from the output Out in phase $\phi2$, the output Out can still be driven by C2. In phase $\phi2$, C3 is disconnected from C2 and is connected across the $In_1$ and $In_2$ inputs of the amplifier stage 202 to sense and store the voltage potential between the $In_1$ and $In_2$ inputs.

In phase $\phi2$, the amplifier 402 is configured with unity gain feedback. Capacitor C1 is connected across the inputs of amplifier 402, and referenced to the $In_1$ input of the amplifier stage 202. The charge that is stored in C1 by amplifier 402 represents the DC offset of the amplifier. Capacitor C1, therefore, samples and stores the DC offset of amplifier 402 in phase $\phi2$, which is then used in phase $\phi1$ to compensate for the DC offset as explained above.

Figure 5:
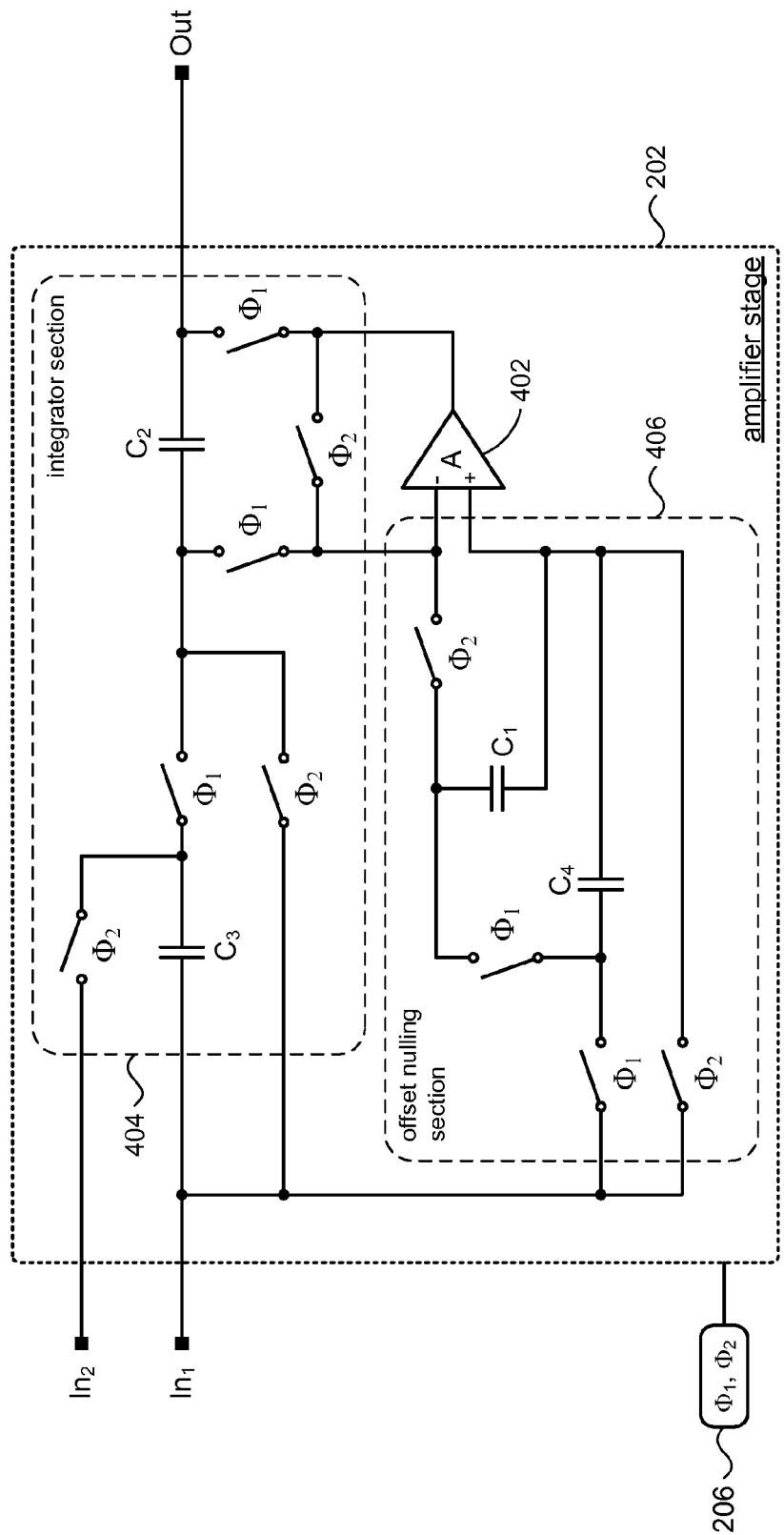
FIGS. 5, 6, and 6A illustrate additional embodiments of an amplifier stage in accordance with the present disclosure.

Referring to FIG. 5, in some embodiments, an additional capacitor C4 may be provided to operate with capacitor C1. Capacitor C4 may provide a filtering function in usage cases where the DC offset that is sampled by C1 may vary from sample to sample, to provide for a more robust storage of the DC offset. In operation, when C1 is sampling the DC offset in phase $\phi2$, C4 is disconnected from the rest of the circuitry and any charge accumulated on C4 remains on C4. In phase $\phi1$, C1 and C4 are connected in parallel and charge sharing between C1 and C4 occurs. Over the course of a number of cycles between phase $\phi1$ and phase $\phi2$, the voltage across C1 and C4 will gradually build up to the DC offset of amplifier 402. Fluctuations in the DC offset sensed by C1 in phase $\phi2$ can be "smoothed" out by C4 in phase $\phi1$. It can be appreciated that, in other embodiments, additional such filtering capacitors may be provided.

Figure 6:
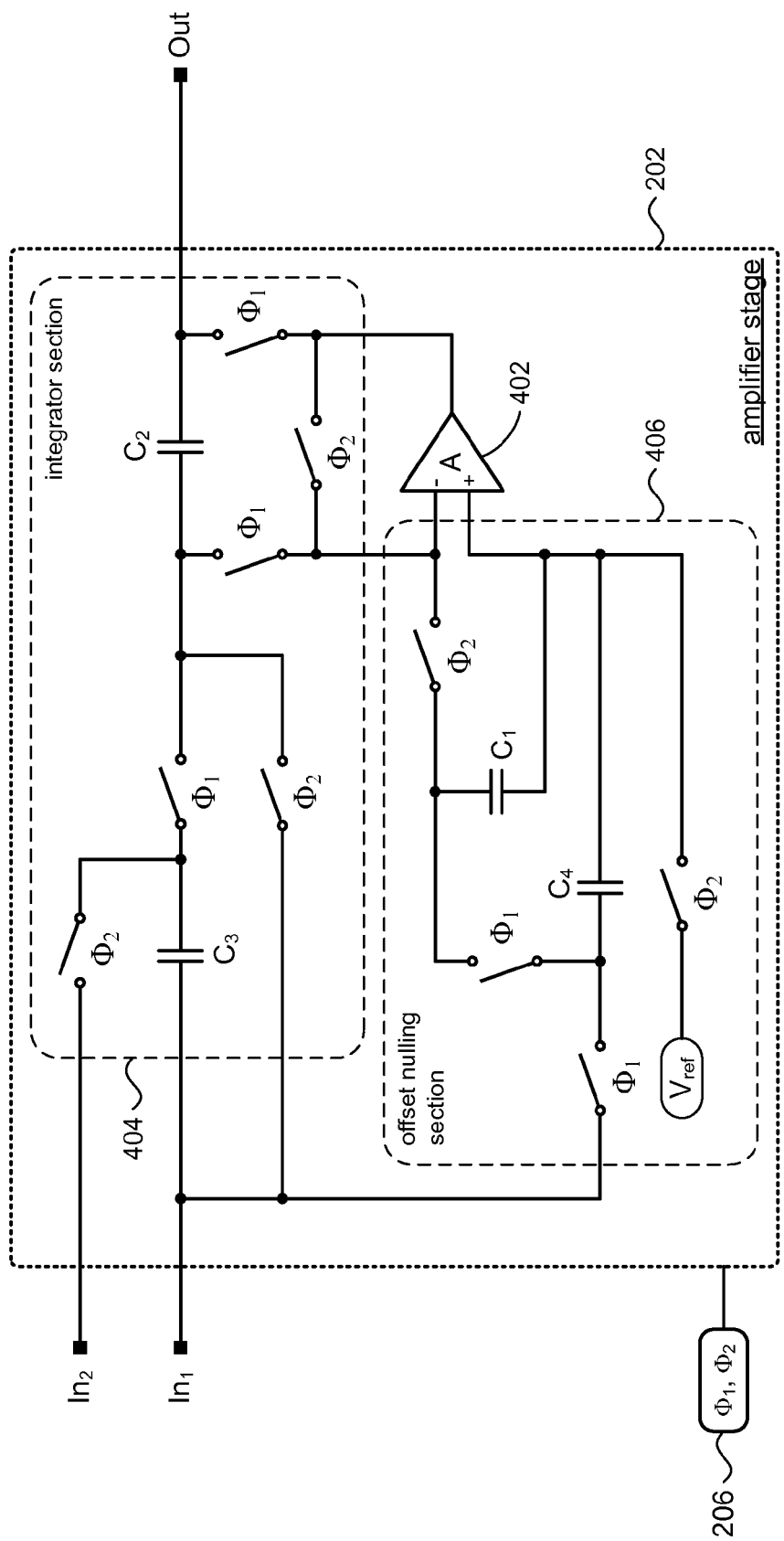
Figure 6A:
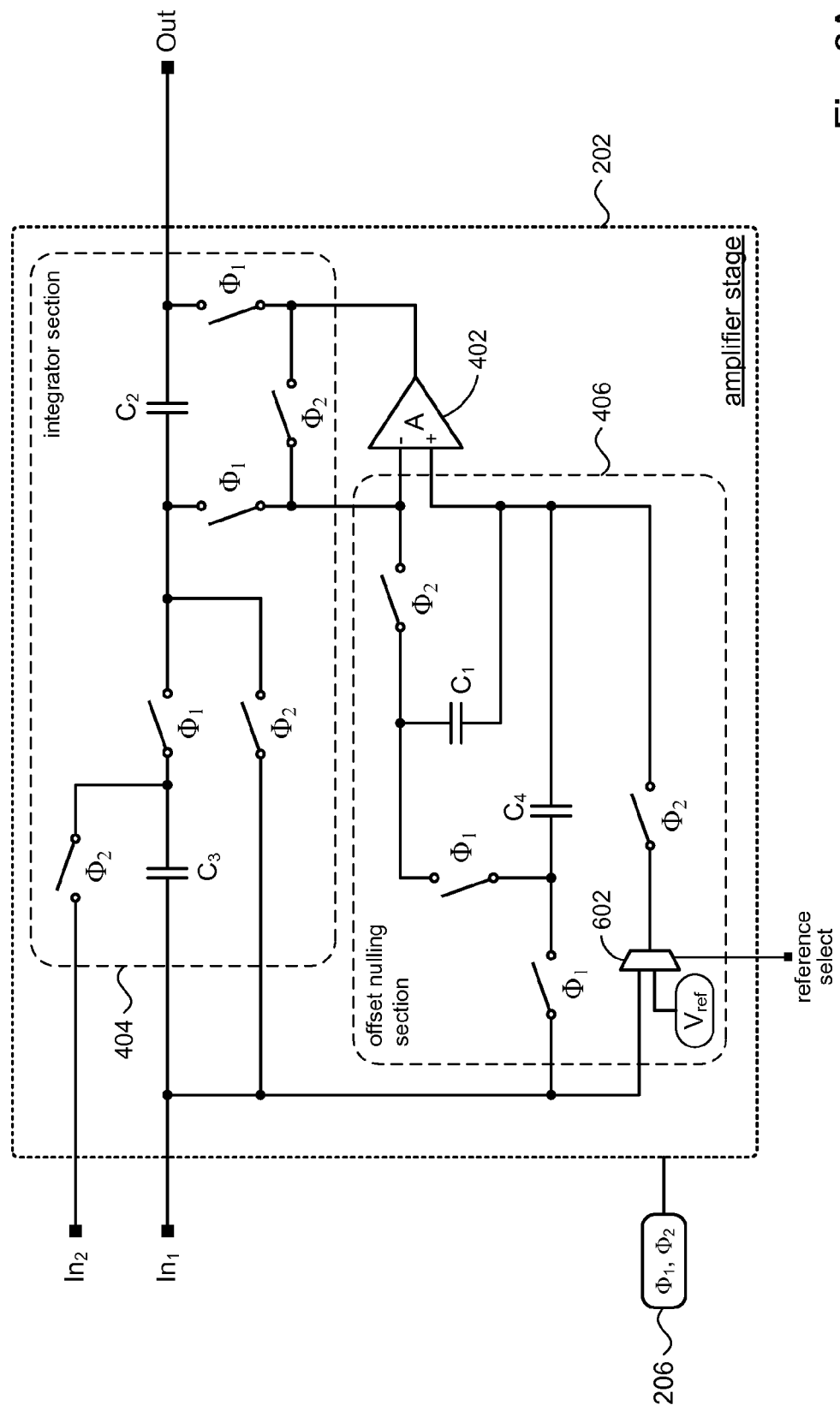
Figure 10A:
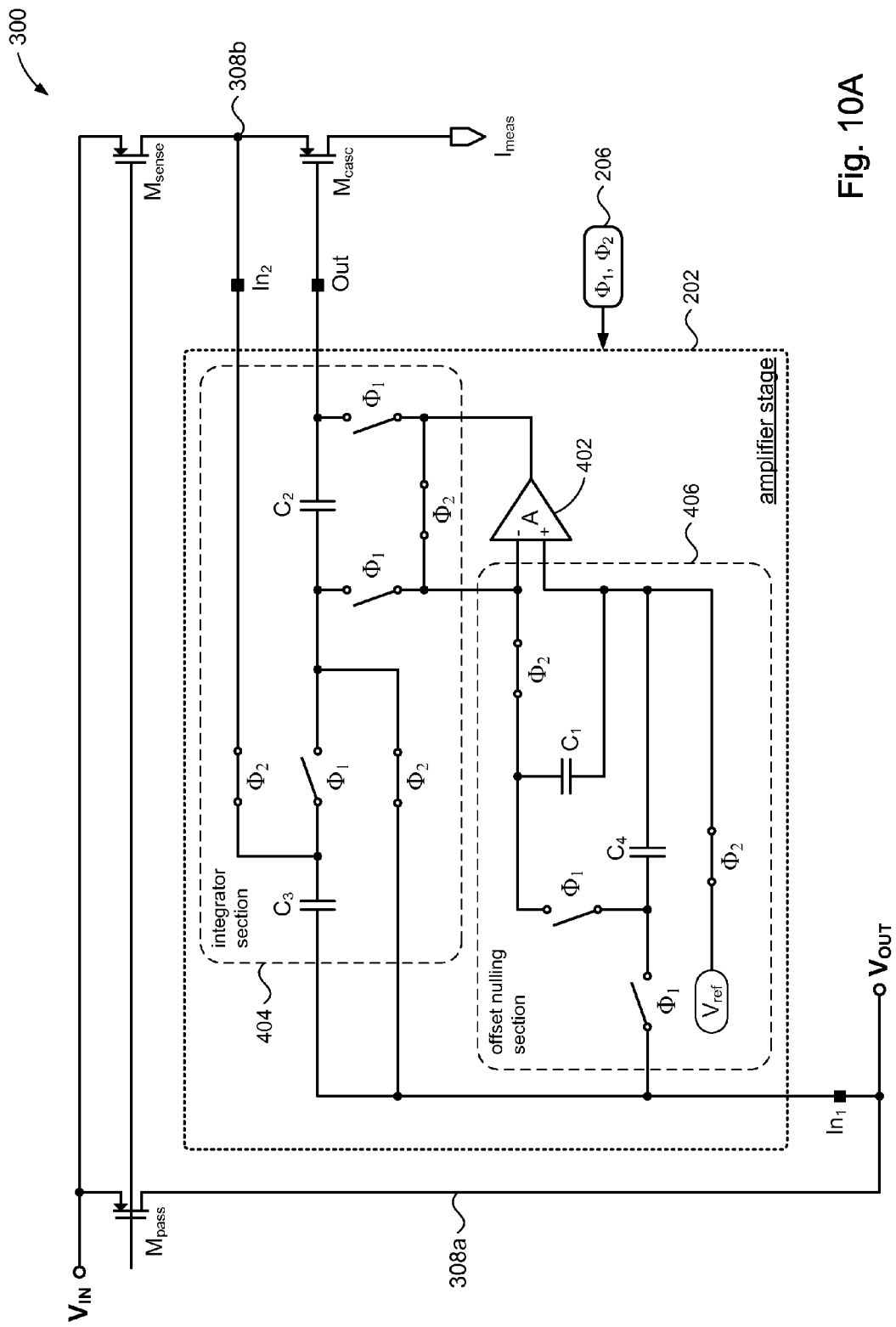
FIG. 10A illustrates phase $\phi 2$ operation of the current sensing circuit of FIG. 3 in accordance with the present disclosure.

Referring to FIG. 6, in some embodiments, the non-inverting input of amplifier 402 may be referenced to a reference voltage $V_{ref}$ instead of the $In_1$ input. This configuration may be suitable in certain usage cases where the voltage difference between $In_1$ and the supply to the amplifier 402 (e.g., $V_{IN}$) is too small. An example of such a usage case is illustrated in FIG. 10A. There is a headroom requirement for the amplifier 402 to operate properly. For example, placing the amplifier 402 in unity gain feedback is problematic if the supply of the amplifier is not sufficiently greater than $In_1$. In that case, the amplifier feedback loop cannot operate correctly. FIG. 6A illustrates an embodiment in which a selector 602 can be used to select between the $In_1$ input or a reference voltage $V_{ref}$ to serve as a reference for the non-inverting input of amplifier 402. FIGS. 6 and 6A show the additional filtering capacitor C4 discussed above. It will be appreciated, of course, that in some embodiments, the filtering capacitor C4 can be omitted.

Figure 10B:
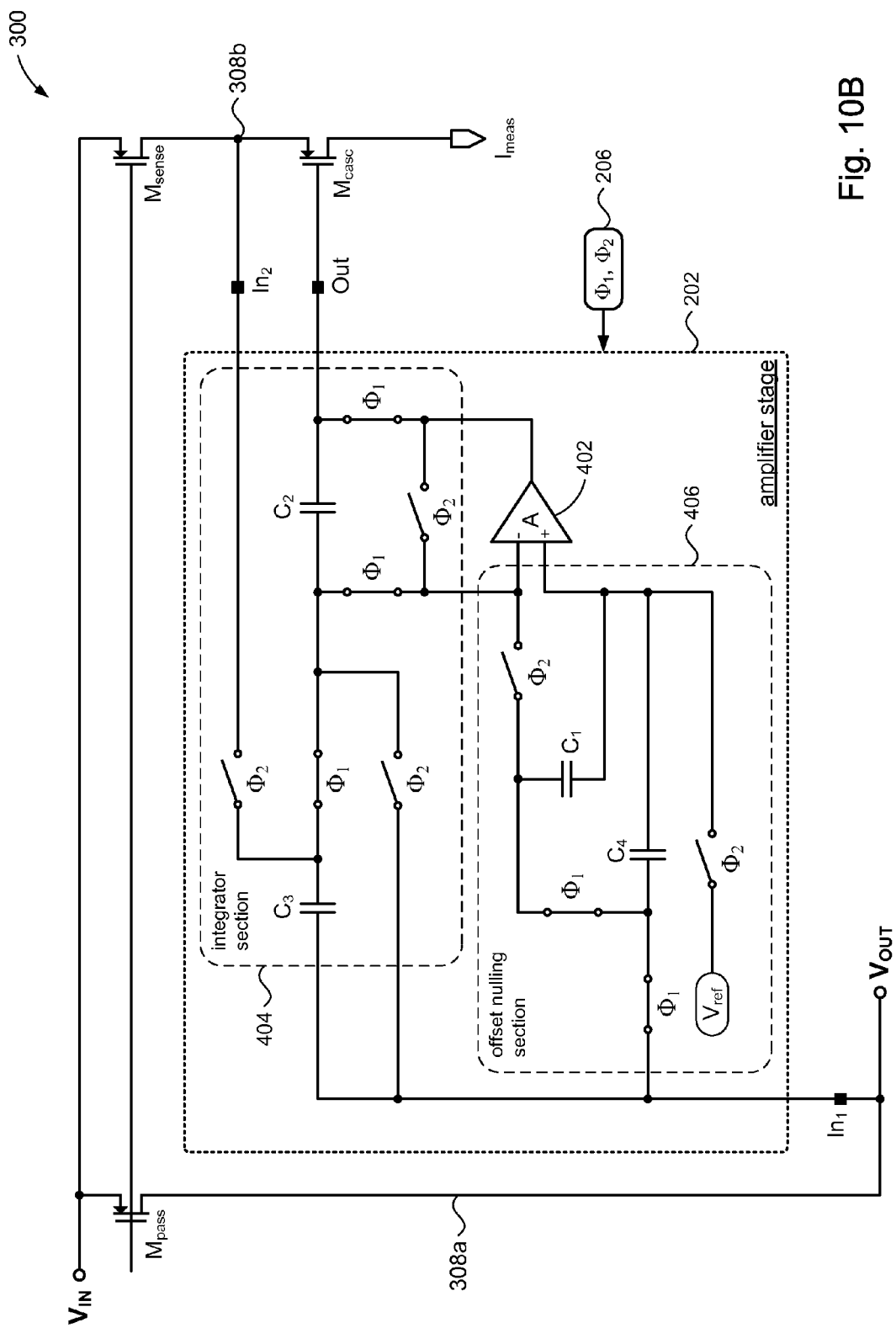
FIG. 10B illustrates phase $\phi 1$ operation of the current sensing circuit of FIG. 3 in accordance with the present disclosure.

Referring for a moment to FIG. 2, basic operations for current sensing in accordance with the present disclosure may be summarized as follows:
  Measuring a potential difference (error) between node being monitored (e.g., 208a) and a control node (e.g., 208b) with a capacitor.
  Integrate the charge on the capacitor onto a second capacitor using an integrator.
  Using the integrator in a negative feedback loop to drive the error to zero.
Specific operations in accordance with the present disclosure may be summarized as follows:
  In one phase (e.g., $\phi2$)
    sample a DC offset of an amplifier onto an offset capacitor (e.g., C1).
    Sample an error onto an error capacitor (e.g., C3),
    Use an output capacitor (e.g., C2) to reduce the error.
  In another phase (e.g., $\phi1$)
    using the amplifier to integrate the sampled error onto the output capacitor,
    using the amplifier to reduce the error,
    using the offset capacitor to compensate the DC offset
Referring to FIGS. 10A and 10B, a description of operation of the amplifier stage 202 in the context of the current sensing circuit 300 shown in FIG. 3 will now be described. FIG. 10A shows an embodiment of the amplifier stage 202 having filtering capacitor C4 and voltage reference $V_{ref}$. As explained above in connection with FIG. 3, the amplifier stage 202 senses the voltage difference between nodes 308a and 308b and regulates $M_{casc}$ to maintain the voltage at node 308b equal to the voltage a node 308a. In the configuration of FIGS. 10A and 10B, since $In_1$ is connected to $V_{OUT}$, if the circuit headroom (difference between $V_{IN}$ and $V_{OUT}$) is too small, then there may be insufficient headroom for amplifier 402 when $In_1$ is used as the reference ("virtual ground") and $V_{IN}$ supplies the amplifier. Accordingly, a separate reference voltage ($V_{ref}$), as shown in FIGS. 10A and 10B, can be provided to ensure sufficient headroom for amplifier 402.

Referring to FIG. 10A, the switches are shown in a configuration for phase $\phi2$. In this configuration of the switches, capacitor C3 is connected across $In_1$ and $In_2$, and to sense the voltage difference across nodes 308a and 308b. C3 therefore senses and stores the error between $V_{DS}$ of the $M_{pass}$ and $M_{sense}$ devices. The amplifier stage 202 will "hold" the gate voltage of $M_{casc}$ using capacitor C2, which is connected to the output Out, to maintain current flow through $M_{casc}$. Thus, even though amplifier 402 is disconnected from the output Out, $M_{casc}$ can still operate adequately during phase φ2 by virtue of the charge on C2. The current $I_{meas}$ through $M_{casc}$ is representative of the load current $I_{load}$. Amplifier 402, being disconnected from the output Out, can be connected in a unity gain loop with capacitor C1 in order to store the DC offset voltage of the amplifier in C1.

Referring FIG. 10B, the switches are in a configuration for phase φ1. In this phase, the voltage on capacitor C3 stores the voltage difference between nodes 308a and 308b sensed during φ2. This voltage difference represents the error between the nodes 308a, 308b that needs to be corrected. Since the output (Out) of amplifier 402 is connected to capacitor C2 and $M_{casc}$, the amplifier can integrate the charge in C3 onto C2 and at the same time regulate $M_{casc}$ according to the error between the nodes 308a, 308b. The charge that is stored in C2 allows C2 to continue to hold the gate voltage of $M_{casc}$ in φ2, when the amplifier 402 is disconnected from $M_{casc}$ to do DC offset sensing. Compensation of the DC offset of amplifier 402 during φ1 occurs by virtue of capacitors C1 (and, in some embodiments, C4) being connected in series with C3. This arrangement allows for continuous ON operation of the load current sensing circuit 300, while allowing for DC offset correction to occur for accurate sensing of the load current.

Figure 11A:
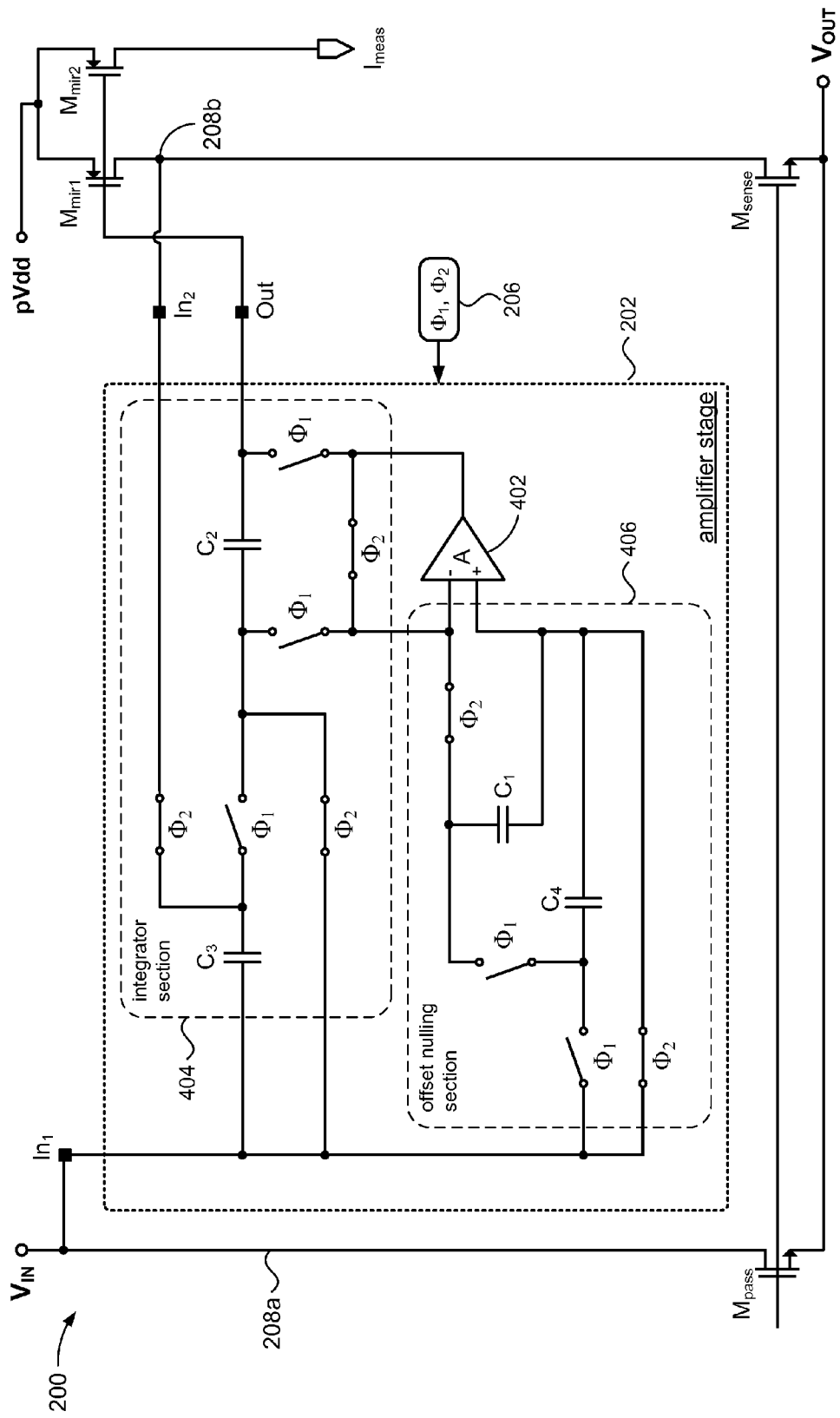
FIG. 11A illustrates phase $\phi 2$ operation of the current sensing circuit of FIG. 2 in accordance with the present disclosure.
Figure 11B:
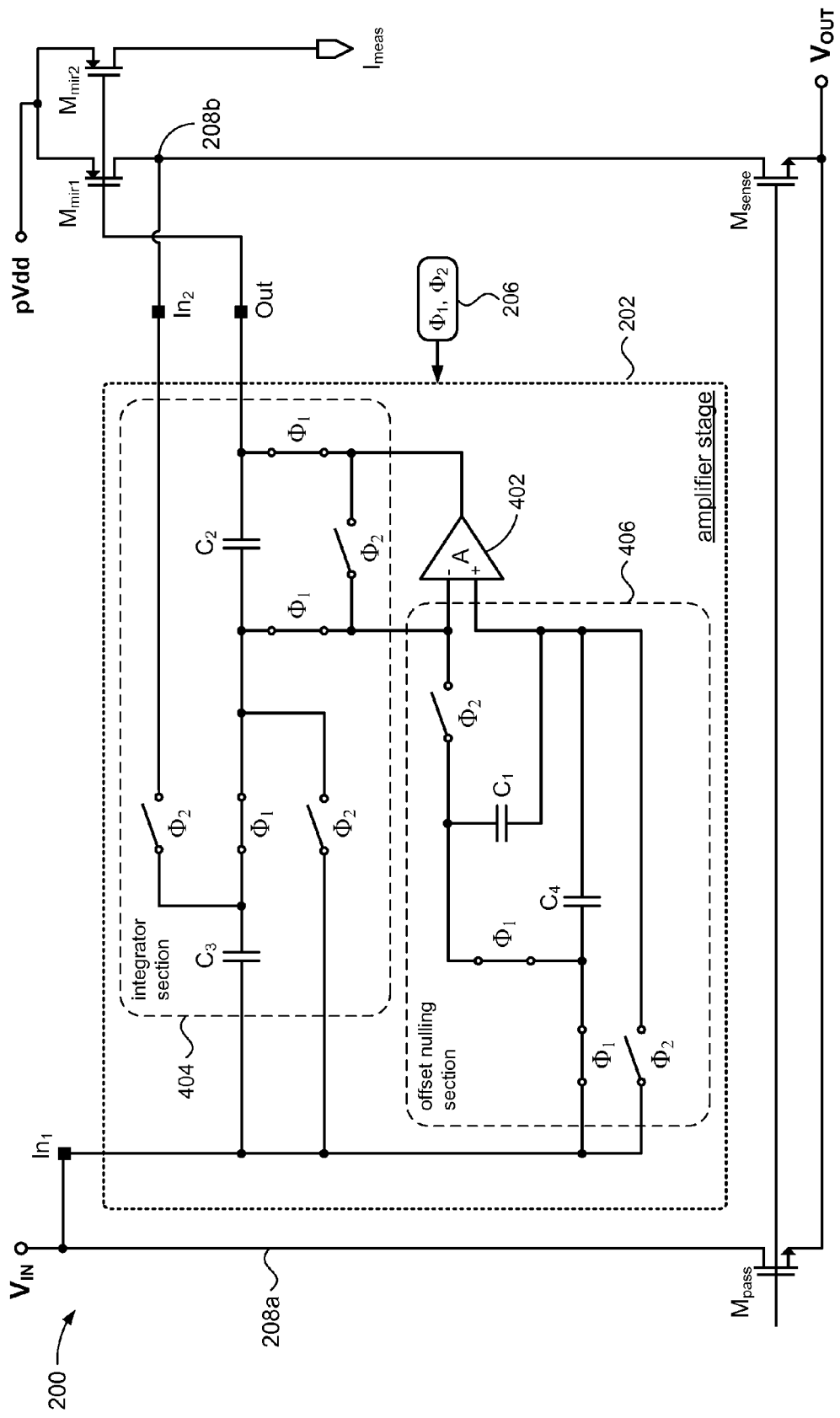
FIG. 11B illustrates phase $\phi 1$ operation of the current sensing circuit of FIG. 2 in accordance with the present disclosure.

Referring to FIGS. 11A and 11B, a description of operation of the amplifier stage 202 in the context of the current sensing circuit 200 shown in FIG. 2 will now be described. FIG. 11A shows an embodiment of the amplifier stage 202 having filtering capacitor C4. As explained above in connection with FIG. 2, the amplifier stage 202 senses the voltage difference (error) between nodes 208a and 208b and regulates $M_{mir1}$ to maintain the voltage at node 208b to be equal to the voltage a node 208a. FET $M_{mir2}$ mirrors the current flow through $M_{mir1}$ to produce an output current $I_{meas}$ that represents the load current $I_{load}$.

In FIG. 11A, the switches are in a configuration for phase φ2. Although amplifier 402 is disconnected from, and hence does not regulate $M_{mir1}$, the gate voltage of FET $M_{mir1}$ continues to operated by virtue of the charge on capacitor C2. Capacitor C1 senses and stores the DC offset of amplifier 402. Capacitor C3 senses and stores the voltage (error) across nodes 208a, 208b.

In FIG. 11B, the switches are in a configuration for phase φ1. The error sensed by C3 during phase φ2 is used by the amplifier 402 to generate a signal to regulate $M_{mir1}$ and to charge C2 so that C2 can continue to hold the gate voltage of $M_{mir1}$ during phase φ2. The DC offset of the amplifier 402 is compensated for by C1 (and, in some embodiments, C4).

Charge injection from operation of the switches φ1 and φ2 can affect the charge stored on the capacitors, thus affecting the voltage on the capacitors and impacting the accuracy of the DC offset function. By using a differential circuit (which suppresses common mode effects) charge injection can be largely made to be a common mode effect, and will hence be largely rejected by the differential circuit.

Figure 12:
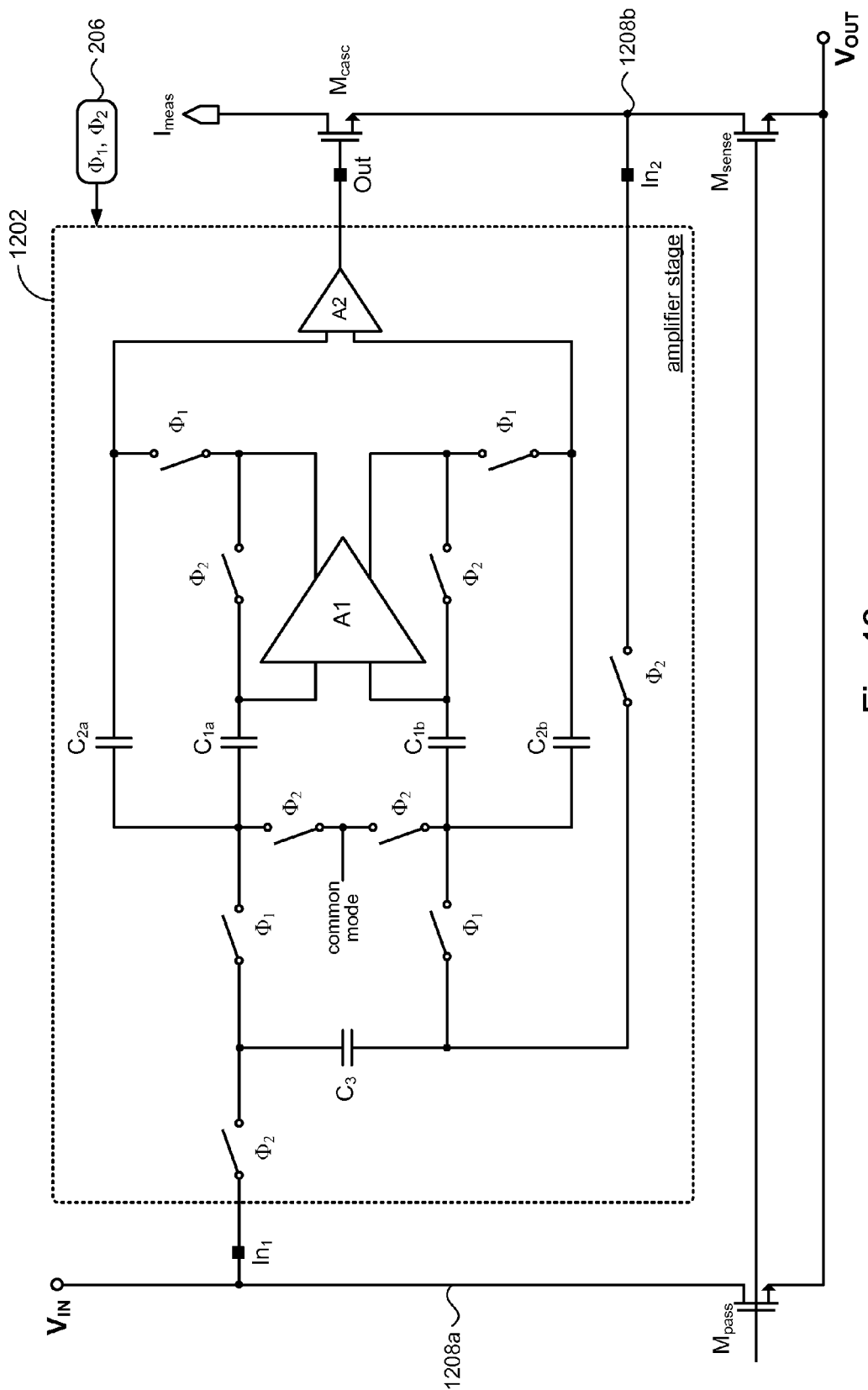
FIG. 12 illustrates an amplifier stage in accordance with another embodiment of the present disclosure.

Referring now to FIG. 12, an amplifier stage 1202 in accordance with another embodiment of the present disclosure may employ a differential integrator design. Using a differential integrator offers the benefit of improving common mode rejection by virtue of the nature of a differential design. FIG. 12 shows an NMOS LDO. It will be appreciated by those of ordinary skill, however, that the differential configuration can be incorporated in a PMOS LDO.

Operation in phase φ1 and phase φ2 is similar to the foregoing embodiments, but in a differential context. The differential inputs of differential amplifier A1 have corresponding capacitors C1a/C1b and C2a/C2b. A2 may be a differential to single-ended amplifier/converter that can convert the differential output from A1 into a control signal at the output OUT.

Capacitors C1a and C1b sense and store the DC offsets in the differential inputs of differential amplifier A1 during phase φ2 and serve as nulling capacitors during phase φ1. The capacitor C3 stores the voltage difference between nodes 308a and 308b sensed during φ2. The charge stored on capacitor C3 can be integrated onto capacitors C2a and C2b during phase φ1, which in turn can serve as holding capacitors during phase φ2 to maintain the input to A2 and hence maintain the output at OUT.

Advantages and Technical Effect

Embodiments in accordance with the present disclosure can provide more accurate current sensing. In particular embodiments, accuracy in current sensing can be achieved by more accurate replication of the voltage drop of a pass transistor onto a sense transistor. Embodiments in accordance with the present disclosure can reduce DC offset in an amplifier using a single opamp auto-zeroing design that can provide continuous-on operation.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

I claim the following:

1. A circuit comprising:
first and second circuit inputs;
a circuit output;
a first capacitor;
a second capacitor connected to the circuit output;
a third capacitor;
an amplifier having first and second amplifier inputs and an amplifier output; and
a plurality of switches operable to be in a first configuration and operable to be in a second configuration,
wherein, in the first configuration of the switches:
   the amplifier output is disconnected from the circuit output;
   the first capacitor is connected across the amplifier inputs to sense a DC offset of the amplifier; and
   the second capacitor is connected only between the circuit output and one of the circuit inputs; and
   the third capacitor is connected only to the first and second circuit inputs,
wherein, in the second configuration of the switches:
   the amplifier output is connected to the circuit output;
   the first capacitor is connected to one of the amplifier inputs to compensate for the DC offset of the amplifier; and
   the second capacitor is connected to the amplifier in a feedback loop.

2. The circuit of claim 1 further comprising wherein in the second configuration of the switches, the third capacitor is connected to both the second capacitor and the amplifier to integrate a charge of the third capacitor onto the second capacitor using the amplifier.

3. The circuit of claim 1 wherein, in both the first configuration of the switches and the second configuration of the switches, one of the circuit inputs is connected to provide a voltage reference point that is common to the first capacitor, the second capacitor, and the amplifier.

4. The circuit of claim 1 wherein, in the first configuration of the switches, the first capacitor is connected between one of the amplifier inputs and one of the circuit inputs.

5. The circuit of claim 1 wherein the first circuit input is connected to a first transistor and the second circuit input is connected to a second transistor.

6. The circuit of claim 5 wherein the first transistor and the second transistor are connected in a current mirror configuration.

7. The circuit of claim 1 wherein the circuit output is connected to an output stage comprising a first transistor.

8. The circuit of claim 7 wherein the first transistor is connected with a second transistor as a cascode.

9. The circuit of claim 7 wherein the first transistor is connected with a second transistor as a current mirror.

10. A circuit comprising:
first and second circuit inputs;
a circuit output;
an amplifier having an output, the output having a first configuration that is not connected to the circuit output and a second configuration that is connected to the circuit output;
an output capacitor that is connected to the circuit output, the output capacitor having a first configuration that is connected to the amplifier in a feedback loop and a second configuration that is not connected to the amplifier;
an input capacitor that is connected to the first circuit input, the input capacitor having a first configuration that is connected to the amplifier in a feedback loop with the output capacitor and a second configuration that is connected to only the second circuit input; and
a first offset capacitor having a first configuration that is connected to first and second inputs of the amplifier and having a second configuration that is connected in series with the input capacitor at a time when the input capacitor is connected to the amplifier in the feedback loop with the output capacitor,
wherein at a time when the amplifier is in the first configuration, the output capacitor is in the first configuration, the input capacitor is in the first configuration, and the offset capacitor is in the first configuration.

11. The circuit of claim 10 further comprising a plurality of switches that are connected to the amplifier, the output capacitor, the input capacitor, and the offset capacitor, each switch being selectively operable to an open position and to a closed position.

12. The circuit of claim 11 further comprising one or more control inputs to receive control signals to operate the switches.

13. The circuit of claim 10 further comprising a plurality of switches that are operable to configure the amplifier in the first configuration, the output capacitor in the first configuration, the input capacitor in the first configuration, and the offset capacitor in the first configuration, and to configure the amplifier in the second configuration, the output capacitor in the second configuration, the input capacitor in the second configuration, and the offset capacitor in the second configuration.

14. The circuit of claim 10 further comprising a second offset capacitor that is configured to be disconnected from the first offset capacitor at a time when the first offset capacitor is in the first configuration, and to be connected in parallel with the first offset capacitor at a time when the first offset capacitor is in the second configuration.

15. The circuit of claim 10 wherein at a time when the amplifier is in the second configuration, the output capacitor is in the second configuration, the input capacitor is in the second configuration, and the offset capacitor is in the second configuration.

16. The circuit of claim 10 wherein the amplifier comprises a single opamp.

17. A circuit comprising:
a pass transistor having an output terminal connectable to a load;
a sense transistor connected to the pass transistor to mirror a current flow through the pass transistor;
an output stage connected to the sense transistor; and
an amplifier circuit having a first circuit input connected to the pass transistor, a second circuit input connected to the sense transistor, and a circuit output connected to the output stage, the amplifier circuit comprising:
an amplifier section having an output that is selectively connectable to and disconnectable from the circuit output;
an integrator section connected to the circuit output and selectively connectable to and disconnectable from the amplifier section; and
an offset nulling section connected to the amplifier section,
wherein the amplifier section is disconnected from the circuit output at a time when the offset nulling section is sampling an offset of the amplifier, and
wherein the integrator section stores a voltage difference between the first and second circuit inputs of the amplifier circuit and provides an output to the circuit output to drive the output stage at a time when the amplifier section is disconnected from the circuit output.

18. The circuit of claim 17 wherein the amplifier section is connected to the circuit output to drive the output stage at a time when the integrator section is connected to the amplifier section in a feedback loop configuration.

19. The circuit of claim 18 wherein the offset nulling section compensates a DC offset of the amplifier section using a sampled DC offset when the integrator section is connected to the amplifier section.

20. The circuit of claim 17 wherein the output stage comprises a transistor connected to the sense transistor as a cascode.

21. The circuit of claim 17 wherein the output stage comprises a current mirror.

22. The circuit of claim 17 wherein the pass transistor further having a control input connectable to a control source.

23. The circuit of claim 22 wherein the control source is an error amplifier of a low dropout regulator.

24. A circuit comprising:
first and second circuit inputs;
a circuit output;
first capacitors;
second capacitors;
a differential amplifier having first and second amplifier inputs and a differential output;

an output amplifier connected to the circuit output, the second capacitors connected to the output amplifier; and a plurality of switches operable to be in a first configuration and operable to be in a second configuration, wherein, in the first configuration of the switches:
  the differential output is disconnected from the output amplifier;
  the first capacitors are connected across the amplifier inputs to sense a DC offset of the differential amplifier; and
  the second capacitors are connected only between the output amplifier and the amplifier inputs, wherein, in the second configuration of the switches:
  the differential output is connected to the output amplifier;
  the first capacitors are connected to the amplifier inputs to compensate for the DC offset of the amplifier; and
  the second capacitors are connected to the differential amplifier in feedback loops.

* * * * *